(12) United States Patent
Gao

(10) Patent No.: US 11,848,188 B2
(45) Date of Patent: Dec. 19, 2023

(54) SEMICONDUCTOR DEVICE AND METHOD FOR MANUFACTURING THE SAME

(71) Applicant: CHANGXIN MEMORY TECHNOLOGIES, INC., Hefei (CN)

(72) Inventor: Wei Gao, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 224 days.

(21) Appl. No.: 17/444,155

(22) Filed: Jul. 30, 2021

(65) Prior Publication Data

US 2021/0358765 A1 Nov. 18, 2021

Related U.S. Application Data

(63) Continuation of application No. PCT/CN2021/076354, filed on Feb. 9, 2021.

(30) Foreign Application Priority Data

Feb. 27, 2020 (CN) .......................... 202010123450.5

(51) Int. Cl.
*H01L 21/321* (2006.01)
*H01L 21/3213* (2006.01)
(Continued)

(52) U.S. Cl.
CPC .... *H01L 21/32139* (2013.01); *H01L 21/0337* (2013.01); *H01L 21/3086* (2013.01); *H01L 21/31144* (2013.01); *H01L 21/76865* (2013.01)

(58) Field of Classification Search
None
See application file for complete search history.

(56) References Cited

U.S. PATENT DOCUMENTS 8,980,757 B2 3/2015 Cinnor
9,666,442 B2 5/2017 Cinnor et al.
(Continued)

FOREIGN PATENT DOCUMENTS

CN 1221971 A 7/1999
CN 1244723 A 2/2000
(Continued)

OTHER PUBLICATIONS

First Office Action of the Chinese application No. 202010123450.5, dated May 6, 2022.
(Continued)

*Primary Examiner* — Roberts P Culbert
(74) *Attorney, Agent, or Firm* — SYNCODA LLC; Feng Ma

(57) ABSTRACT

A method for manufacturing the semiconductor device includes: providing a layer to be etched; on a surface of the layer to be etched, forming a first sacrificial layer that is patterned and includes an opening for exposing the layer to be etched; forming a second sacrificial layer in the opening, the second sacrificial layer having a contact face contacted with the first sacrificial layer; forming a third sacrificial layer via a reaction between the first sacrificial layer and the second sacrificial layer at the contact face; removing at least one of at least part of an unreacted portion of the first sacrificial layer and the second sacrificial layer to form a patterned mask structure; etching the layer to be etched based on the patterned mask structure to form an etched pattern.

10 Claims, 20 Drawing Sheets

(51) Int. Cl.
*H01L 21/033* (2006.01)
*H01L 21/308* (2006.01)
*H01L 21/311* (2006.01)
*H01L 21/768* (2006.01)

(56) References Cited

U.S. PATENT DOCUMENTS

| | | |
|---|---|---|
| 10,276,395 B2 | 4/2019 | Chen et al. |
| 10,340,149 B2 | 7/2019 | Shih et al. |
| 10,832,925 B2 | 11/2020 | Harumoto et al. |
| 2004/0185382 A1 | 9/2004 | Byun |
| 2013/0034965 A1 | 2/2013 | Kim |
| 2014/0073137 A1 | 3/2014 | Cinnor |
| 2014/0273513 A1* | 9/2014 | Mita ............. G03F 7/168 438/763 |
| 2015/0187592 A1 | 7/2015 | Cinnor et al. |
| 2016/0020098 A1 | 1/2016 | Cheng et al. |
| 2018/0050368 A1 | 2/2018 | Harumoto et al. |
| 2018/0286692 A1 | 10/2018 | Chen et al. |
| 2019/0074187 A1 | 3/2019 | Shih et al. |
| 2022/0102372 A1* | 3/2022 | Choi ............. H10B 43/27 |

FOREIGN PATENT DOCUMENTS

| | | |
|---|---|---|
| CN | 101452225 A | 6/2009 |
| CN | 101566793 A | 10/2009 |
| CN | 101910947 A | 12/2010 |
| CN | 101303525 B | 12/2012 |
| CN | 103871846 A | 6/2014 |
| CN | 103999191 A | 8/2014 |
| CN | 104062846 A | 9/2014 |
| CN | 106486346 A | 3/2017 |
| CN | 107768277 A | 3/2018 |
| CN | 108257854 A | 7/2018 |
| CN | 108666207 A | 10/2018 |
| CN | 109427555 A | 3/2019 |

OTHER PUBLICATIONS

International Search Report in the international application No. PCT/CN2021/076354, dated May 10, 2021.
Second Office Action of the Chinese application No. 202010123450. 5, dated Jul. 27, 2022.
Third Office Action of the Chinese application No. 202010123450. 5, dated Oct. 8, 2022.
Written Opinion of the International Search Authority in the international application No. PCT/CN2021/076354, dated May 10, 2021.

\* cited by examiner

SEMICONDUCTOR DEVICE AND METHOD FOR MANUFACTURING THE SAME

CROSS-REFERENCE TO RELATED APPLICATIONS

This application is a continuation of International Application No. PCT/CN2021/076354 filed on Feb. 9, 2021, which claims priority to Chinese Patent Application No. 202010123450.5 filed on Feb. 27, 2020. The disclosures of these applications are hereby incorporated by reference in their entirety.

BACKGROUND

DRAM (Dynamic Random-Access Memory), i.e., a dynamic random access memory chip, is the most common memory chip. Over the years, the DRAM has continued to develop toward smaller dimensions, allowing more circuits to be packaged per chip. In this way, the capacity per unit area is increased, the cost can be reduced, and the function is improved. However, it is necessary to continuously reduce the minimum linewidth and spacing designed in the integrated circuit.

SUMMARY

The disclosure relates to a semiconductor device and a method for manufacturing the same.

Various embodiments the disclosure provide a method for manufacturing a semiconductor device. The method includes the following operations: providing a layer to be etched; on a surface of the layer to be etched, forming a first sacrificial layer that is patterned and includes an opening for exposing the layer to be etched; forming a second sacrificial layer in the opening, and the second sacrificial layer having a contact face contacted with the first sacrificial layer; forming a third sacrificial layer via a reaction between the first sacrificial layer and the second sacrificial layer at the contact face; removing at least one of at least part of an unreacted portion of the first sacrificial layer, an unreacted portion of the second sacrificial layer and the third sacrificial layer, to form a patterned mask structure; etching the layer to be etched based on the patterned mask structure to form an etched pattern.

Various embodiments of the disclosure further provide a semiconductor device. The semiconductor device includes a layer to be etched; a first sacrificial layer that is patterned and located on a surface of the layer to be etched, and including an opening for exposing the layer to be etched; a second sacrificial layer located in the opening; a third sacrificial layer located between the second sacrificial layer and the first sacrificial layer, and formed via a reaction between the first sacrificial layer and the second sacrificial layer.

The following drawings and description show one or more examples of the disclosure or technical solutions in conventional technology for details. Other features and advantages of this disclosure will become apparent from the specification, drawings, and claims.

BRIEF DESCRIPTION OF THE DRAWINGS

In order to more clearly illustrate the examples of the disclosure or technical solutions in conventional technology, the disclosure will be further described below with the drawings for illustrating the examples of the disclosure or technical solutions in conventional technology. It is apparent that the drawings illustrated in the following description only show some examples of the disclosure. Those skilled in the art can also obtain other drawings according to these drawings without any creative work.

In the figures.

10: layer to be etched, 20: first sacrificial layer, 201: opening, 202: first sacrificial layer unit, 30: second sacrificial layer, 40: contact face, 50: third sacrificial layer, 60: patterned mask structure, and 70: etched pattern.

DETAILED DESCRIPTION

When the feature size of the exposure line is close to the theoretical resolution limit of the exposure system, the imaging of the surface of the silicon wafer is seriously distorted, resulting in a serious deterioration in the quality of the photolithographic pattern.

Hereinafter, the disclosure will be described more fully with reference to the accompanying drawings in order to facilitate an understanding of the disclosure. Preferred examples of the disclosure are shown in the accompanying drawings. However, the disclosure may be implemented in many different forms and is not limited to the examples described herein. Rather, the purpose of providing these examples is to make the contents of the disclosure more thorough and comprehensive.

Unless otherwise specified, all technical and scientific terms as used herein have the same meaning as commonly understood by those skilled in the art to which the disclosure belongs. The terms used in the specification of the disclosure herein are merely for the purpose of describing specific embodiments, and are not intended to limit the disclosure. As used herein, the term "and/or" includes any and all combinations of one or more of the relevant listed items.

In the description of the disclosure, it should be understood that the orientations or positional relationships indicated by the term "upper", "lower", "vertical", "horizontal", "inner", or "outer" etc. are based on the orientations or positional relationships shown in the accompanying drawings, only for the convenience of describing the disclosure and simplifying the description, rather than indicating or implying that the device or element referred to must have a specific orientation, be constructed and operated along a specific orientation, so cannot be understood as a limitation of the disclosure.

Figure 1:
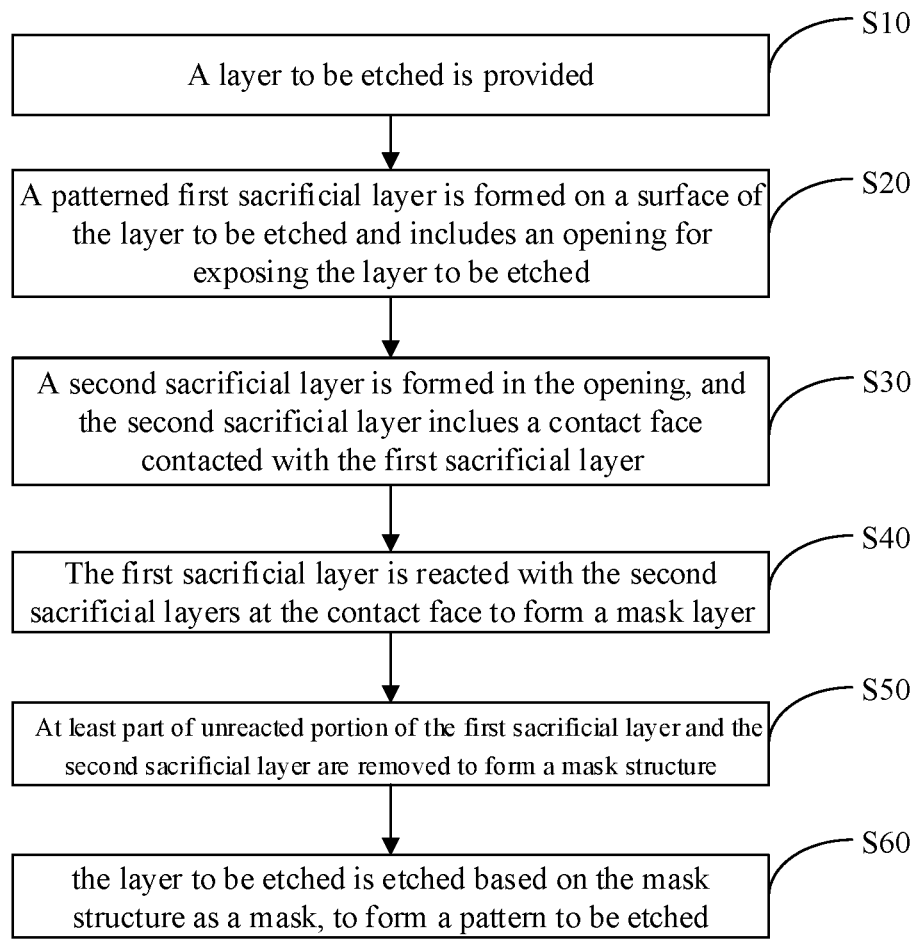
FIG. 1 is a flow chart of a method for manufacturing a semiconductor device according to some embodiments of the disclosure.

In the example shown in FIG. 1, a method for manufacturing a semiconductor device is provided. The method includes the following operations. A layer to be etched 10 is provided. A first sacrificial layer 20 that is patterned and includes an opening 201 for exposing the layer to be etched 10 is formed on a surface of the layer to be etched 10. A second sacrificial layer 30 is formed in the opening 201, and the second sacrificial layer 30 has a contact face 40 contacted with the first sacrificial layer 20. The first sacrificial layer 20 is reacted with the second sacrificial layer 30 at the contact face 40 to form a third sacrificial layer 50. At least one of at least part of an unreacted portion of the first sacrificial layer 20, an unreacted portion of the second sacrificial layer 30 and the third sacrificial layer 50 is removed to form a patterned mask structure 60. The layer to be etched 10 is etched based on the patterned mask structure 60 to form an etched pattern 70.

In this example, the above method for manufacturing the semiconductor device allows the first sacrificial layer 20 to have a larger feature size in the case of the same dimensions of the devices. Thus, it is possible to further reduce the dimensions of the device, improve the yield of the device, increase the production efficiency, and save the cost.

Figure 2A:
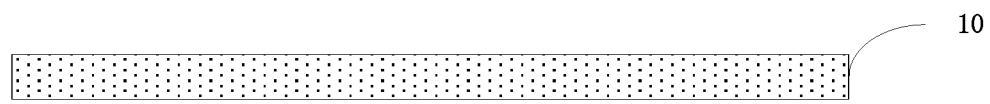
FIG. 2A schematically shows a first structure presented in a step of the method for manufacturing the semiconductor device according to some embodiments of the disclosure.
Figure 2B:
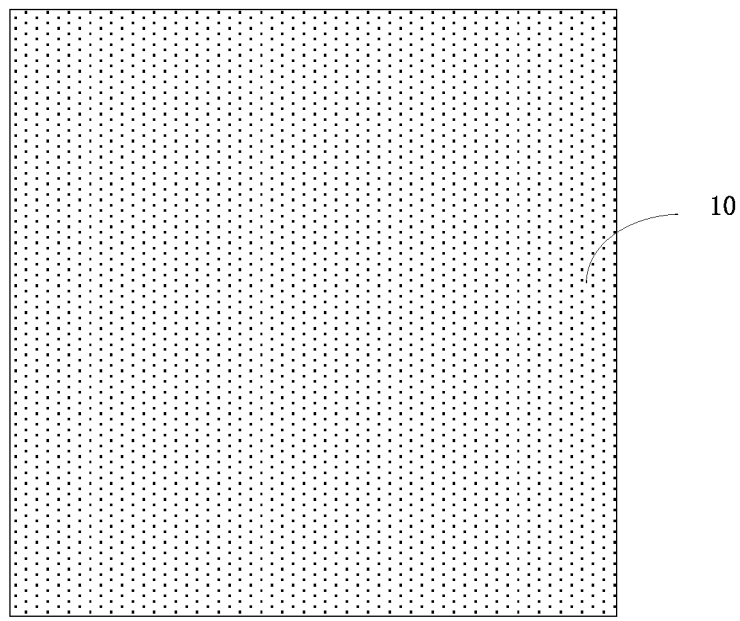
FIG. 2B schematically shows a second structure presented in a step of the method for manufacturing the semiconductor device according to some embodiments of the disclosure.

At S10, the layer to be etched 10 is provided, as shown in FIGS. 2A-2B.

In one example, the layer to be etched 10 includes one or a combination of a Si substrate layer, a Si—Ge substrate layer, a silica layer, a silicon nitride layer, a poly-silicon layer, a low-K dielectric material, amorphous carbon, and a metal layer.

Figure 3A:
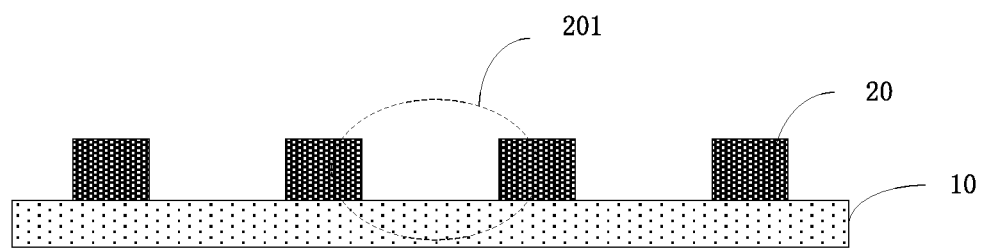
FIG. 3A schematically shows a third structure presented in a step of the method for manufacturing the semiconductor device according to some embodiments of the disclosure.
Figure 3B:
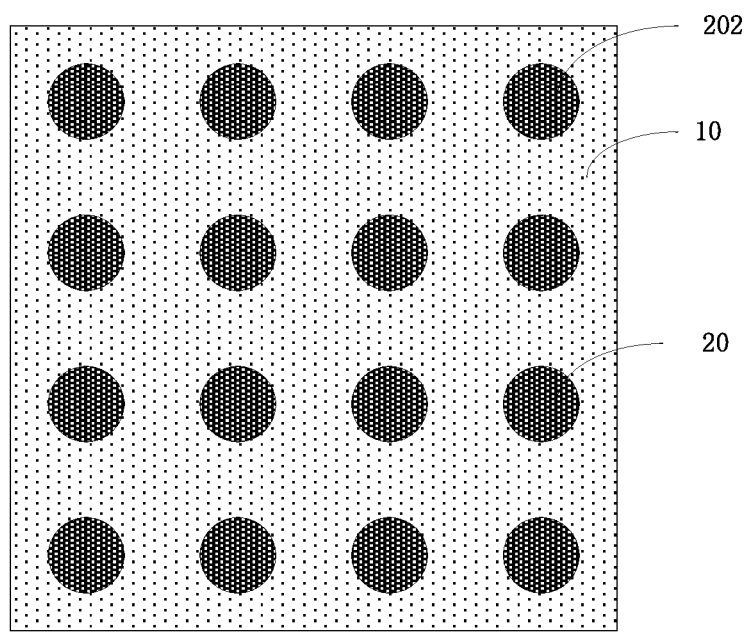
FIG. 3B schematically shows a fourth structure presented in a step of the method for manufacturing the semiconductor device according to some embodiments of the disclosure.

At S20, the first patterned sacrificial layer 20 is formed on the surface of the layer to be etched 10, and the first sacrificial layer 20 includes the opening 201 for exposing the layer to be etched 10, as shown in FIGS. 3A-3B.

In this example, a photolithography process is used to form the first patterned sacrificial layer 20 on the surface of the layer to be etched 10.

In one example, the first sacrificial layer 20 includes a photoresist.

In one example, the first sacrificial layer 20 includes an acrylic polymer.

In one example, the first sacrificial layer 20 contains a neutralizing agent.

In one example, the first sacrificial layer 20 includes a phenolic resin-based compound.

In one example, the first sacrificial layer 20 includes several first sacrificial layer units 202.

In one example, the first sacrificial layer unit 202 when viewed above has a shape including a circle, triangle, or quadrangle.

The first sacrificial layer unit 202 when viewed above may have a shape of any polygon. Regardless of the shape of the first sacrificial layer unit 202, it falls within the protection scope of the present disclosure.

In one example, the first sacrificial layer unit 202 has a columnar structure. The several first sacrificial units 202 are arranged in a multi-row multi-column array.

Figure 10:
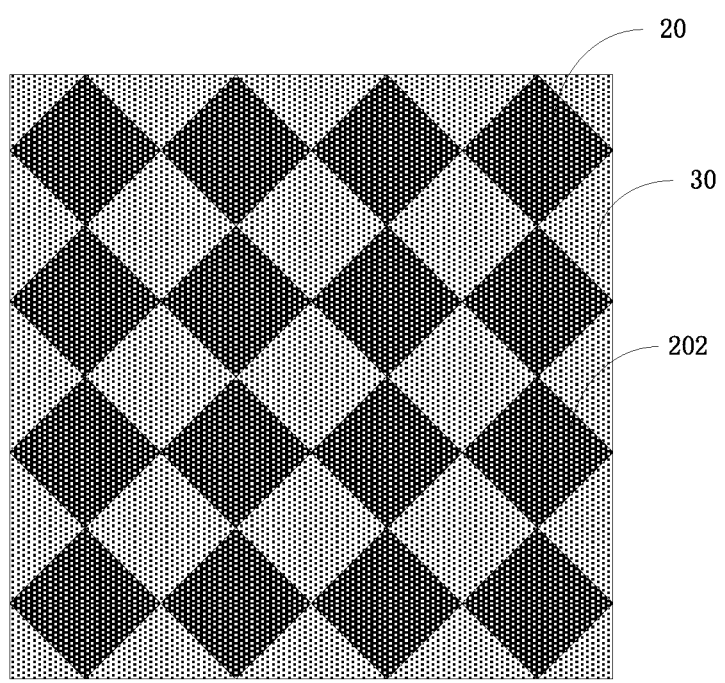
FIG. 10 schematically shows a structure of the first sacrificial layer and the second sacrificial layer of the semiconductor device according to some embodiments of the disclosure.

In one example, the first sacrificial layer unit 202 when viewed above has a shape of rectangular, as shown in FIG. 10.

In one example, the first sacrificial layer 20 includes several first sacrificial layer units 202 that have the shape of circle and are arranged in an array. The first sacrificial layer unit 202 has a diameter between 31 nm-75 nm. For example, the diameter of the first sacrificial layer unit 202 may be 33 nm, 40 nm, 45 nm, 50 nm, 60 nm, or 70 nm. A distance between adjacent first sacrificial layer units 202 is between 31 nm and 95 nm. For example, the distance between adjacent first sacrificial layer units 202 may be 33 nm, 40 nm, 45 nm, 50 nm, 60 nm, 70 nm, 80 nm, or 90 nm. In one example, it may be implemented that the first sacrificial layer unit 202 has the diameter of 41 nm, and the distance between adjacent first sacrificial layer units 202 is 41 nm.

In one example, the several first sacrificial layer units 202 are connected and contacted with each other, to form several first sacrificial layers 20 in a shape of strip.

In one example, the several first sacrificial layer units 202 are connected and contacted into one piece.

Figure 4A:
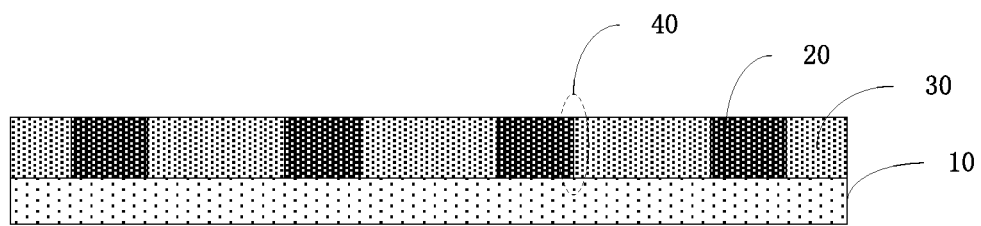
FIG. 4A schematically shows a fifth structure presented in a step of the method for manufacturing the semiconductor device according to some embodiments of the disclosure.
Figure 4B:
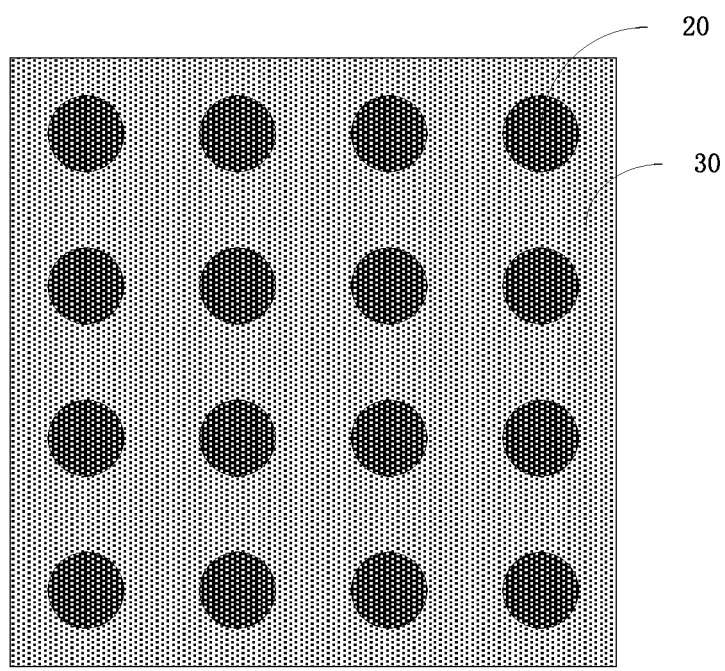
FIG. 4B schematically shows a sixth structure presented in a step of the method for manufacturing the semiconductor device according to some embodiments of the disclosure.

At S30, the second sacrificial layer 30 is formed in the opening 201, and the second sacrificial layer 30 includes a contact face 40 contacted with the first sacrificial layer 20, as shown in FIGS. 4A-4B.

In one example, the second sacrificial layer 30 contains a photobase generator.

In one example, the second sacrificial layer 30 includes a photoresist, a polyallylamine mixture, or a mixture containing a polymer resin.

In one example, the second sacrificial layer 30 is formed on the surface of the first sacrificial layer 20 and the layer to be etched 10.

Figure 5A:
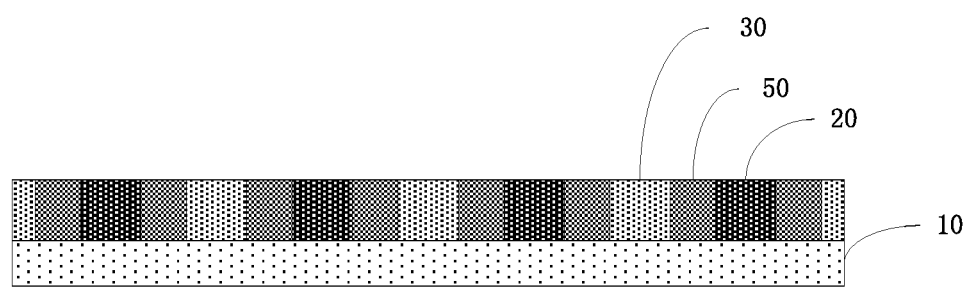
FIG. 5A schematically shows a seventh structure presented in a step of the method for manufacturing the semiconductor device according to some embodiments of the disclosure.
Figure 5B:
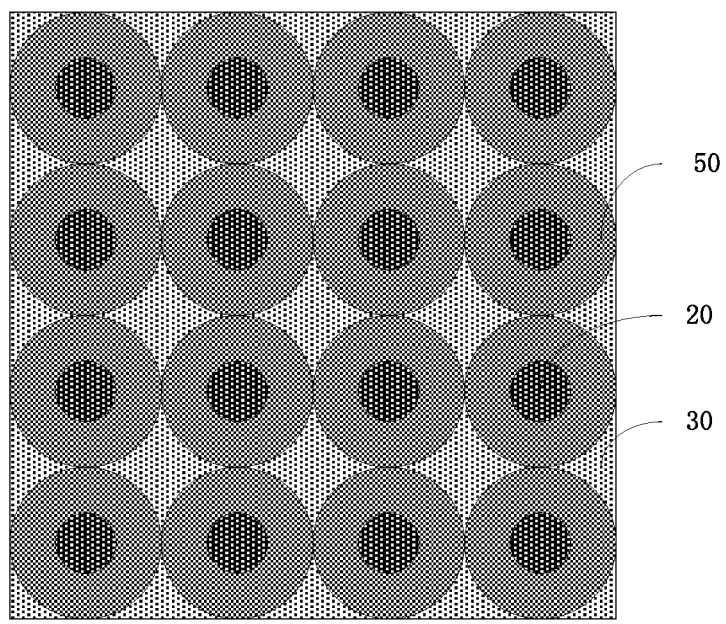
FIG. 5B schematically shows a structure of the semiconductor device according to some embodiments of the disclosure.

At S40, the first sacrificial layer 20 is reacted with the second sacrificial layer 30 at the contact face 40, to generate the third sacrificial layer 50, as shown in FIGS. 5A-5B.

Figure 5C:
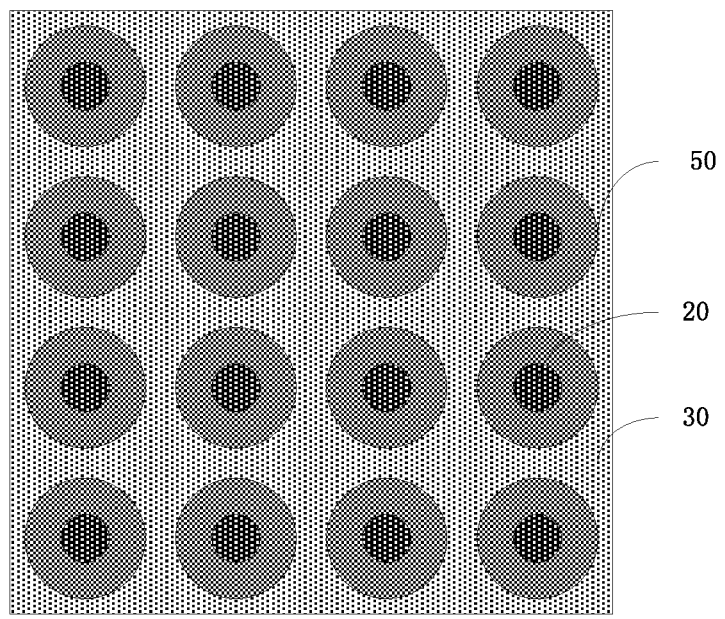
FIG. 5C schematically shows an eighth structure presented in a step of the method for manufacturing the semiconductor device according to some embodiments of the disclosure.

In this example, the third sacrificial layers 50 at the periphery of the adjacent first sacrificial layer units 202 may adjoin each other, or have a gap between them, as shown in FIG. 5C.

In one example, at step S40, the first sacrificial layer 20 and the second sacrificial layer 30 are subjected with a heat treatment so that the first sacrificial layer 20 is reacted with the second sacrificial layer 30 at the contact face 40 to form the third sacrificial layer 50.

In one example, the heat treatment is performed for 30 seconds and 90 seconds, and the heat treatment is performed under a temperature of 50° C. to 160° C.

In one example, the heat treatment includes a baking under a temperature of 130° C. to 150° C., for example, 130° C., 140° C. or 150° C. The baking is performed for 8 minutes to 12 minutes. In one example, the time for baking is 10 minutes.

In one example, the heat treatment is performed for 30 seconds and 90 seconds. For example, the time of the heat treatment may be 30 seconds, 50 seconds, or 90 seconds. The heat treatment is performed under a temperature of 50° C. to 160° C. For example, the temperature of the heat treatment may be 50° C., 80° C., 100° C. or 160° C.

In one example, the third sacrificial layer 50 has a width between 22 nm and 28 nm, a maximum linear distance between the unreacted portions of the first sacrificial layer 20 is comprised between 30 nm and 40 nm, and a maximum linear distance between the unreacted portions of the second sacrificial layer 30 is comprised between 30 nm and 40 nm. In one example, the third sacrificial layer 50 may have a width of 25 nm, the maximum linear distance between the unreacted portions of the first sacrificial layer 20 may be 35 nm, and the maximum linear distance between the unreacted portions of the second sacrificial layer 30 may be 35 nm.

At S50, at least one of at least part of the unreacted portion of the first sacrificial layer 20, the unreacted portion of the second sacrificial layer 30 and the third sacrificial layer 50 is removed to form a patterned mask structure 60.

In one example, the at least part of the unreacted portion of the first sacrificial layer 20 and the second sacrificial layer 30 are removed to form the patterned mask structure 60.

In one example, step S50 includes the following operations.

Figure 6A:
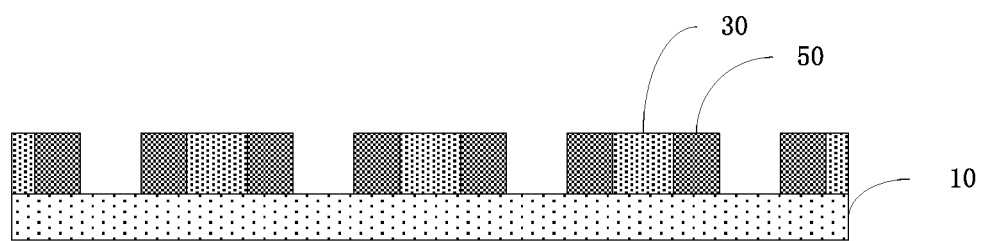
FIG. 6A schematically shows a ninth structure presented in a step of the method for manufacturing the semiconductor device according to some embodiments of the disclosure.
Figure 6B:
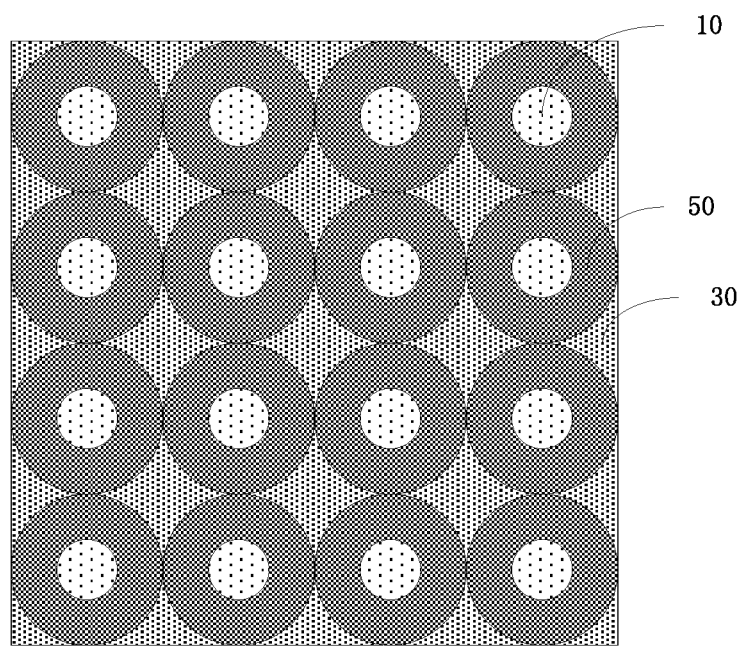
FIG. 6B schematically shows a tenth structure presented in a step of the method for manufacturing the semiconductor device according to some embodiments of the disclosure.

At S501, the at least part of the unreacted portion of the first sacrificial layer 20 is removed, as shown in FIGS. 6A-6B.

Figure 7A:
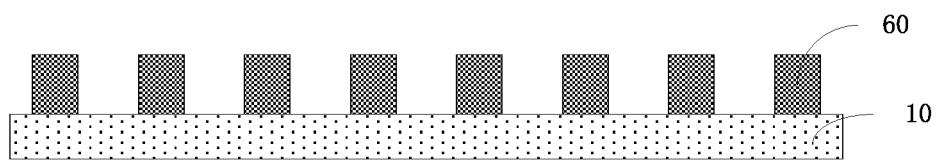
FIG. 7A schematically shows an eleventh structure presented in a step of the method for manufacturing the semiconductor device according to some embodiments of the disclosure.
Figure 7B:
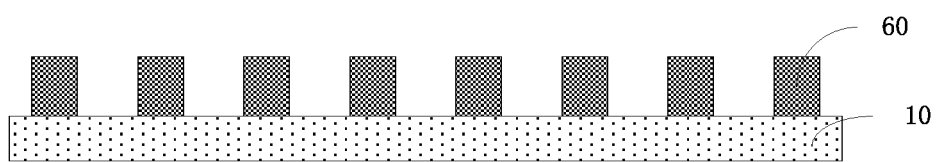
FIG. 7B schematically shows a twelfth structure presented in a step of the method for manufacturing the semiconductor device according to some embodiments of the disclosure.

At S502, at least part of the unreacted portion of the second sacrificial layer 30 is removed, as shown in FIGS. 7A-7B.

In one example, at step S501, the unreacted portion of the first sacrificial layer 20 are removed.

In one example, since a width of the part of the unreacted portion of the second sacrificial layer 30 is too small to be removed, only the part of the unreacted portion with a larger width of the second sacrificial layer 30 can be removed.

Figure 8A:
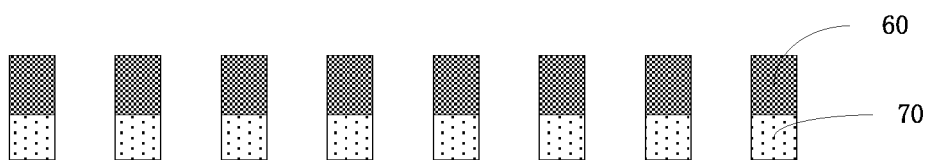
FIG. 8A schematically shows a thirteenth structure presented in a step of the method for manufacturing the semiconductor device according to some embodiments of the disclosure.
Figure 8B:
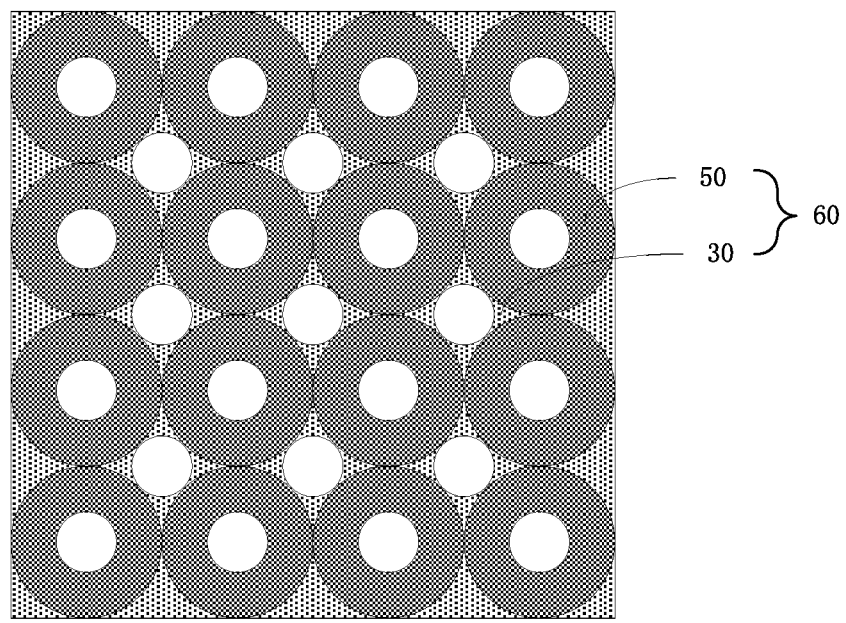
FIG. 8B schematically shows a fourteenth structure presented in a step of the method for manufacturing the semiconductor device according to some embodiments of the disclosure.

At S60, the layer to be etched 10 is etched based on the patterned mask structure 60 to form an etched pattern 70, as shown in FIG. 8A-8B.

In one example, the method after step S60, further includes the following operations.

Figure 9A:
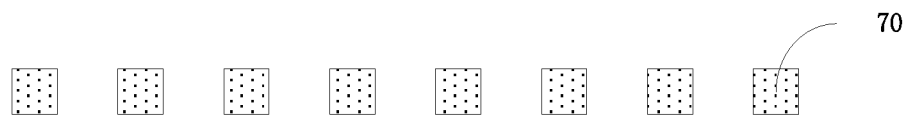
FIG. 9A schematically shows a fifteenth structure presented in a step of the method for manufacturing the semiconductor device according to some embodiments of the disclosure.
Figure 9B:
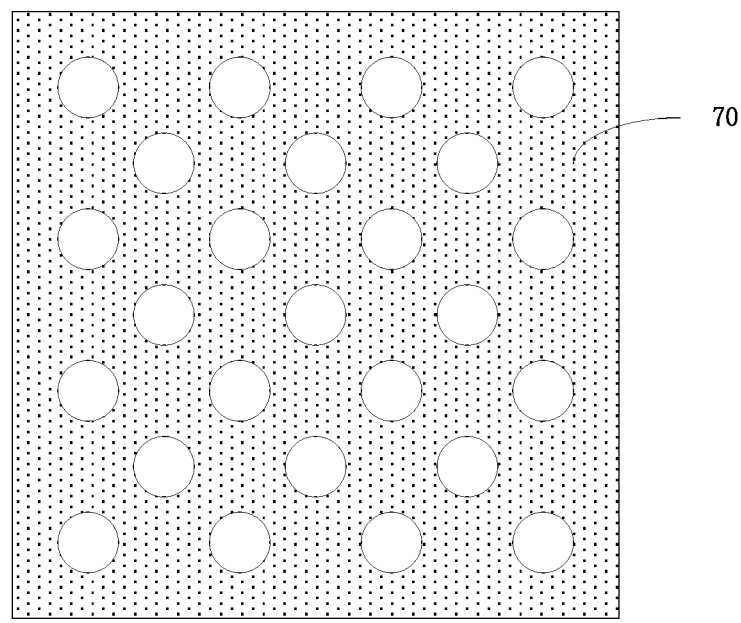
FIG. 9B schematically shows a sixteenth structure presented in a step of the method for manufacturing the semiconductor device according to some embodiments of the disclosure.

At S70, the patterned mask structure 60 is removed, as shown in FIGS. 9A-9B.

As the example shown in FIG. 5b, a semiconductor device is provided. This semiconductor device includes a layer to be etched 10; a first sacrificial layer 20 that is patterned and located on a surface of the layer to be etched 10 and includes an opening 201 for exposing the layer to be etched 10; a second sacrificial layer 30 located in the opening 201; a third sacrificial layer 50 that is located between the second sacrificial layer 30 and the first sacrificial layer 20, and is formed via a reaction between the first sacrificial layer 20 and the second sacrificial layer 30.

In this example, the above semiconductor device allows the first sacrificial layer 20 to have a larger feature size in the case of the same dimensions of the devices. Thus, it is possible to further reduce the dimensions of the device, improve the yield of the device, increase the production efficiency, and save the cost.

In one example, the layer to be etched 10 includes one or a combination of a silicon oxide layer, a silicon nitride layer, a poly-silicon layer, a low-K dielectric material, amorphous carbon, or a metal layer. In one example, the first sacrificial layer 20 includes a photoresist. In one example, the first sacrificial layer 20 includes an acrylic polymer.

In one example, the first sacrificial layer 20 includes several first sacrificial layer units 202.

In one example, the first sacrificial layer unit 202 when viewed above has a shape including a circle, triangle, or quadrangle.

In one example, the first sacrificial layer unit 202 has a columnar structure. The several first sacrificial units 202 are arranged in a multi-row multi-column array.

Figure 11:
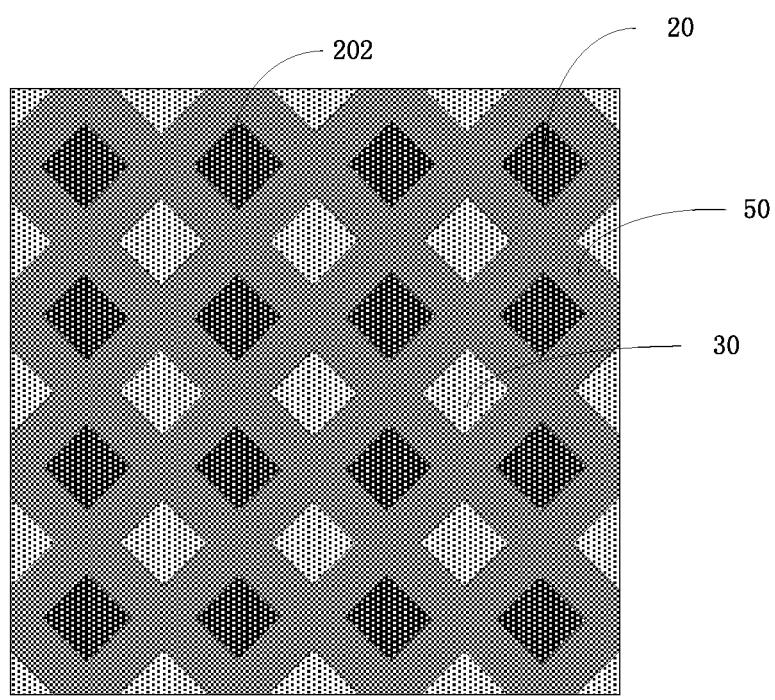
FIG. 11 schematically shows a structure of the semiconductor device according to some embodiments of the disclosure.

In one example, the first sacrificial layer unit 202 when viewed above has a shape of rectangular, as shown in FIG. 11.

In one example, the first sacrificial layer 20 includes several first sacrificial layer units 202 that have the shape of circle and are arranged in an array.

In one example, the several first sacrificial layer units 202 are connected in contact to form several first sacrificial layers 20 in a shape of strip.

In one example, the several first sacrificial layer units 202 are connected in contact into one piece.

In one example, the first sacrificial layer 20 includes several first sacrificial layer units 202 arranged in a multi-row multi-column array. The first sacrificial layer unit 202 includes a columnar structure and has a cross-sectional shape including a circle, a triangle, or a quadrangle.

In one example, the second sacrificial layer 30 includes a photoresist. In one example, the second sacrificial layer 30 includes polyallylamine.

In one example, the third sacrificial layer 50 has a width between 22 nm and 28 nm, a maximum linear distance between the unreacted portions of the first sacrificial layer 20 is comprised between 30 nm and 40 nm, and a maximum linear distance between the unreacted portions of the second sacrificial layer 30 is comprised between 30 nm and 40 nm. In one example, the third sacrificial layer 50 may have a width of 25 nm, the maximum linear distance between the unreacted portions of the first sacrificial layer 20 may be 35 nm, and the maximum linear distance between the unreacted portions of the second sacrificial layer 30 may be 35 nm.

The technical features of the above examples may be combined freely. In order to describe briefly, the descriptions are not made on all possible combinations of the technical features of the examples. However, the combinations of these technical features should be construed as falling into a scope of the specification as long as there is no conflict in these combinations.

The above examples only describe several implementation modes of the present application. The description is specific and detailed, but cannot be understood as limitations to a scope of the present application. It is noted that those of ordinary skill in the art can further make multiple modifications and improvements without departing from a concept of the present application and those also belong to the protection scope of the present application. Therefore, the protection scope of the present application shall only be limited by the appended claims.

What is claimed is:

1. A method for manufacturing a semiconductor device, comprising:
    providing a layer to be etched;
    on a surface of the layer to be etched, forming a first sacrificial layer that is patterned and comprises an opening for exposing the layer to be etched, wherein the first sacrificial layer comprises several first sacrificial layer units having a diameter between 31 nm and 75 nm, a distance between adjacent first sacrificial layer units is between 31 nm and 95 nm, and the first sacrificial layer units when viewed above have a shape comprising a circle, a triangle, or a quadrangle;
    forming a second sacrificial layer in the opening, the second sacrificial layer having a contact face contacted with the first sacrificial layer;
    subjecting the first sacrificial layer and the second sacrificial layer at the contact face with a heat treatment to form a third sacrificial layer via a reaction between the first sacrificial layer and the second sacrificial layer at the contact face, wherein the third sacrificial layer has a width between 22 nm and 28 nm;
    at least removing at least one of part of an unreacted portion of the first sacrificial layer and an unreacted portion of the second sacrificial layer, to form a patterned mask structure, and thus to reduce a size of the semiconductor device; and
    etching the layer to be etched based on the patterned mask structure to form an etched pattern.

2. The method for manufacturing a semiconductor device according to claim 1, wherein the part of the unreacted portion of the first sacrificial layer and the second sacrificial layer are at least removed to form the patterned mask structure.

3. The method for manufacturing a semiconductor device according to claim 2, wherein the unreacted portion of the first sacrificial layer and the part of the unreacted portion of the second sacrificial layer are removed to form the patterned mask structure.

4. The method for manufacturing a semiconductor device according to claim 1, wherein the first sacrificial layer comprises a neutralizing agent and the second sacrificial layer comprises a photobase generator.

5. The method for manufacturing a semiconductor device according to claim 1, wherein the first sacrificial layer comprises a photoresist or a phenolic resin-based compound.

6. The method for manufacturing a semiconductor device according to claim 1, wherein the second sacrificial layer comprises a photoresist, a polyallylamine mixture, or a mixture containing a polymer resin.

7. The method for manufacturing a semiconductor device according to claim 1, wherein the heat treatment is performed for 30 seconds and 90 seconds, and the heat treatment is performed under a temperature of 50° C. and 160° C.

8. The method for manufacturing a semiconductor device according to claim 1, wherein the first sacrificial layer unit comprises a columnar structure, and several first sacrificial layer units are arranged in a multi-row multi-column array.

9. The method for manufacturing a semiconductor device according to claim 1, wherein the several first sacrificial layer units are connected in contact to form several first sacrificial layers in a shape of strip.

10. The method for manufacturing a semiconductor device according to claim 1, wherein the several first sacrificial layer units are connected in contact into one piece.

* * * * *